US007733925B2

(12) United States Patent
Pushkarsky et al.

(10) Patent No.: US 7,733,925 B2
(45) Date of Patent: Jun. 8, 2010

(54) CONTINUOUS WAVELENGTH TUNABLE LASER SOURCE WITH OPTIMUM POSITIONING OF PIVOT AXIS FOR GRATING

(75) Inventors: Michael Pushkarsky, San Diego, CA (US); David F. Arnone, Mountain View, CA (US)

(73) Assignee: Daylight Solutions, Inc., Poway, CA (US)

( * ) Notice: Subject to any disclaimer, the term of this patent is extended or adjusted under 35 U.S.C. 154(b) by 0 days.

(21) Appl. No.: 12/168,693

(22) Filed: Jul. 7, 2008

(65) Prior Publication Data

US 2010/0002734 A1 Jan. 7, 2010

(51) Int. Cl.
*H01S 3/10* (2006.01)
*H01S 3/08* (2006.01)
(52) U.S. Cl. .................... 372/20; 372/92; 372/98; 372/102
(58) Field of Classification Search .................. 372/20, 372/92, 98, 99, 102
See application file for complete search history.

(56) References Cited

U.S. PATENT DOCUMENTS

| 5,802,085 | A * | 9/1998 | Lefevre et al. | 372/20 |
|---|---|---|---|---|
| 6,597,710 | B2 * | 7/2003 | Vilhelmsson et al. | 372/20 |
| 6,731,661 | B2 * | 5/2004 | Trutna, Jr. | 372/20 |
| 7,230,960 | B2 * | 6/2007 | Nguyen et al. | 372/20 |
| 2003/0063633 | A1 * | 4/2003 | Zhang et al. | 372/20 |
| 2004/0165640 | A1 * | 8/2004 | Clifford et al. | 372/97 |
| 2007/0223554 | A1 * | 9/2007 | Hunter et al. | 372/102 |
| 2008/0298406 | A1 * | 12/2008 | Day et al. | 372/39 |

OTHER PUBLICATIONS

Haim Lotem, Mode-hop suppression of Littrow grating-tuned lasers: comment, 20 Month 1994, p. 1, vol. 33, No. 00, Applied Optics.
Patrick McNicholl and Harold J. Metcalf, Synchronous cavity mode and feedback wavelength scanning in dye laser oscillators with gratings, Sep. 1, 1985, pp. 2757-2761, vol. 24, No. 17, Applied Optics, ©1985 Optical Society of America.
M. De Labachelerie and G. Passedat, Mode-hop suppression of Littrow grating-tuned lasers, Jan. 20, 1993, pp. 269-272vol. 32, No. 3, Applied Optics, ©1993 Optical Society of America.

* cited by examiner

*Primary Examiner*—Minsun Harvey
*Assistant Examiner*—Phillip Nguyen
(74) *Attorney, Agent, or Firm*—Roeder & Broder LLP

(57) ABSTRACT

A laser source (10) for generating a continuously wavelength tunable light (12) includes a gain media (16), an optical output coupler (36F), a cavity collimator (38A), a diffraction grating (30), a grating beam (54), and a beam attacher (56). The diffraction grating (30) is spaced apart from the cavity collimator (38A) and the grating (30) cooperates with the optical output coupler (36F) to define an external cavity (32). The grating (30) includes a grating face surface (42A) that is in a grating plane (42B). The beam attacher (56) retains the grating beam (54) and allows the grating beam (54) and the grating (30) to effectively pivot about a pivot axis (33) that is located approximately at an intersection of a pivot plane (50) and the grating plane (42B). As provided herein, the diffraction grating (30) can be pivoted about the unique pivot axis (33) to move the diffraction grating (30) relative to the gain media (16) to continuously tune the lasing frequency of the external cavity (32) and the wavelength of the output light (12) so that the output light (12) is mode hop free.

20 Claims, 9 Drawing Sheets

CONTINUOUS WAVELENGTH TUNABLE LASER SOURCE WITH OPTIMUM POSITIONING OF PIVOT AXIS FOR GRATING

GOVERNMENT SPONSORED DEVELOPMENT

The U.S. Government has rights in this invention pursuant to contract number DE-FG02-06ER84631 with the United States Department of Energy.

BACKGROUND

Lasers are commonly used to generate light. One type of laser includes a wave guided gain media, a collimating optics (collimator), and a plane diffraction grating, retroreflacting light, which together define an external cavity for the laser. This type of laser is commonly referred to as having a Littrow configuration. In this configuration, light generated by the gain media is directed through the collimator at the diffraction grating, and the diffraction grating reflects the light back to the gain media through the collimator. With this design, the primary wavelength of the light generated by the laser is dependent upon the angle of incidence of the collimated light of the diffraction grating.

In certain designs, it is desirable that the laser is adapted to be selectively and continuously tuned across desired wavelength (or frequency) range. With a Littrow type laser, the output wavelength can be adjusted continuously by simultaneous adjustment of the grating angle with respect to the incident beam and a cavity length of the external cavity.

Some prior art laser designs have suggested that a unique pivot axis exists about which the diffraction grating can be pivoted to move the diffraction grating relative to the gain media to continuously adjust the wavelength of the output light. Unfortunately, none of the prior art laser designs have properly located the unique pivot axis. As a result thereof, these prior art lasers suffer from mode hops that lead to frequency jumps in the output light. Thus, the prior art lasers are not able to accurately provide a continuously tunable output light.

SUMMARY

The present invention is directed to a laser source for generating narrow linewidth and a continuously wavelength tunable light. In one embodiment, the laser source includes an integrated optical waveguided semiconductor gain media, preferentially supporting lasing in a single transversal mode, an external cavity arrangement consisting of a cavity collimator and a diffraction grating attached to a grating beam and a beam attacher, comprising a mechanism for simultaneous rotation and translation of the grating with respect to the rest of external cavity. The gain media generates the light, and the gain media includes a first facet and a second facet. The first facet may serve as the laser output coupler, if it partially reflects light, or external output coupler can be arranged near the first facet if the first facet is AR coated. The second facet can be AR coated. The cavity colliminator is positioned in the cavity near the second facet to collimate diverging output emanating from the second facet. The diffraction grating is spaced apart from the cavity collimator and cooperates with the optical output coupler to form the external laser cavity.

In certain embodiments, the present invention describes the method of moving the external cavity diffraction grating with respect to the rest of external cavity components to quickly and accurately generate any wavelength output within the spectral range of the gain media while preserving lasing at the same laser cavity longitudinal mode, i.e. to accomplish so called mode hope free tuning.

In one embodiment, the cavity collimator is spaced apart from the second facet, and the cavity collimator has a collimator apex located on a collimator surface that faces away from the second facet. Further, light traveling between the collimator apex and the optical output coupler has an apex/coupler group optical length, and wherein light exiting the collimator towards the grating at the collimator apex travels along an optical axis that is defined by the gain media and the cavity collimator.

As provided herein, the beam attacher allows the grating beam and the grating to effectively pivot about a pivot axis that is located approximately at an intersection a grating plane and a pivot plane. Further, the pivot plane is normal to the optical axis, and the pivot plane is spaced apart from the collimator apex the apex/coupler group optical length.

According to properties known to skilled in art, any optical ray normal to said plane propagating toward the gain media will travel the same group optical length Lo to the optical output coupler. Lo is defined as $$L\_opt = \Sigma_i (L_i \cdot n_i)$$

where $L_i$ and $n_i$ are a physical length and group index of every media along the said optical ray propagation path from Plane A to the output coupler, respectively. Group index is an optical property of the media, know to those skilled in art.

As provided further herein, the continuous tuning of the output wavelength is accomplished via pivoting the diffraction grating about any pivot axis contained in pivot plane accompanied by an arbitrary motion of the pivot axis in the pivot plane. It follows that If the pivot axis is fixed in pivot plane the continuous tuning is accomplished by pure pivoting about the pivot axis.

In certain embodiments, the general teaching of present invention is reduced to a simpler form. In the embodiment containing a semiconductor media with straight waveguide and with both facets normal to the waveguide, a partially reflecting first facet being the output coupler, and a single cavity collimator being located coaxially with the gain media, the L0 is reduced to $L\_lens*n\_lens+L\_gain*n\_gain$ (where $L\_lens$ is the physical length of the collimator, $n\_lens$ is the group index of refraction of the collimator, $L\_gain$ is the physical length of the gain media, and $n\_gain$ is the group index of refraction of the gain media), and the plane A is coincident with an apex of the collimator surface facing the grating and normal to the direction of propagation of the collimated beam. The other way to describe the pivot axis position is to say that the pivot plane is positioned parallel to the gain media facets at a distance $$L\_lens*(n\_lens-1)+L\_media*(n\_gain-1)$$

away from the first facet of the gain medium, in the direction away from the gain media.

In certain embodiments the grating is mounted to the grating beam, which in turn is retained by the beam attacher. As provided herein, the beam attacher retains the grating beam, and the beam attacher allows the grating beam and the grating to effectively pivot the diffraction grating with respect to the rest of external cavity laser components. The diffraction grating is mounted on the beam attacher in a manner that the grating grooves are parallel to the pivot axis and grating pivot axis belongs to the plane containing grating working surface.

In one embodiment, the beam attacher includes a bearing (s) and the bearing rotational axis defines the pivot axis.

Alternatively, the beam attacher can include a flexure mechanism that retains the grating beam and allows for effective pivoting about the pivot axis defined by the flexure design.

Additionally the laser can include an actuator that enables pivoting motion of the grating beam and thus change the output wavelength and an encoder that communicate with actuator driver to select desirable angle of the grating beam with respect to the collimated laser beam, and thus select desired wavelength.

Moreover, the laser source can include a mounting base that fixedly retains the gain media and the collimating lens in a coaxial relationship. Further, the beam attacher can be fixedly attached to the mounting base.

Further, the attacher location on the mounting base can be finely adjusted with respect to the gain media to achieve precise positioning of the pivot axis in the pivot plane.

In another embodiment, the laser source includes a temperature controller that is in thermal communication with the mounting base, the temperature controller controlling the temperature of the mounting base and the gain media. The laser source also includes a current driver, capable of supplying constant current through the gain media, as well as capable of modulating the current to provide auxiliary amplitude and wavelength modulation of the laser output.

In certain embodiments, the gain media is a quantum cascade type gain media and the cavity collimator is an aspheric collimator and the diffraction grating is either a ruled grating or replicated grating or holographic grating or etched grating operating in the first or higher orders.

As provided herein, the partially reflecting first facet of the gain media can serve as an optical output coupler. In certain embodiments the reflectivity of the first facet can be adjusted to optimize laser output power or wavelength tuning range. In certain embodiments the first facet may be AR coated and an external output coupler can be positioned close to the first facet.

In certain embodiments the second output collimator is positioned close to the first facet to collimate the output light.

In certain embodiments the waveguide can be non-straight and or the facet(s) may be angled with respect to the waveguide to minimize residual reflectivity off the AR coated facet(s).

In certain embodiments, the pure pivotal motion of the grating beam with respect to the beam attacher is implemented. In certain embodiments the combination of pivoting motion accompanied by pivot axis motion in the pivot plane is implemented, notably in the case when pure pivoting is practically non-feasible due to pivoting mechanism design limitations.

The present invention is also directed to a method for manufacturing a laser source and a method for calculating the location of a pivot plane.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
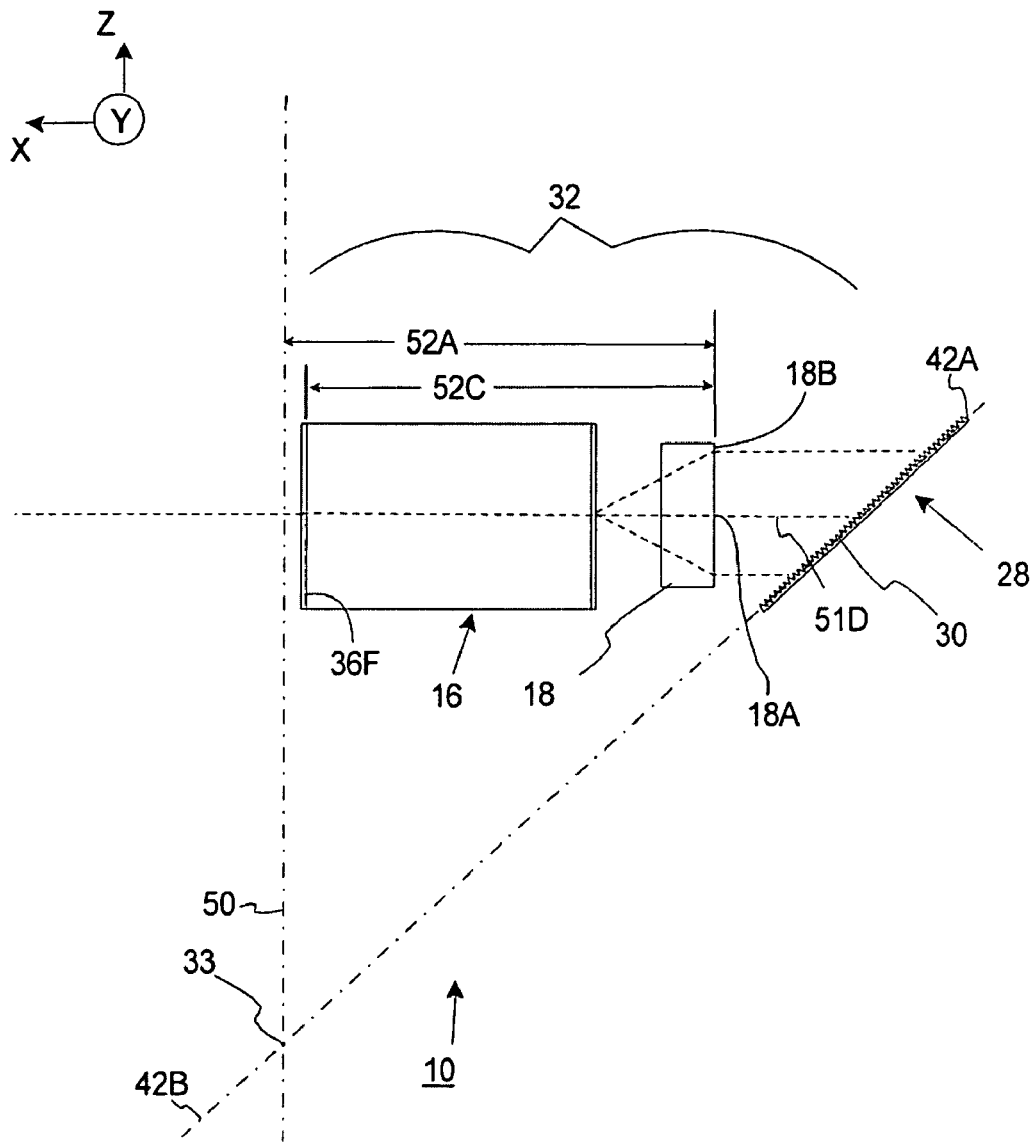
FIG. 1A is simplified top illustration of a laser source having features of the present invention.

FIG. 1A is a simplified top view of a laser source 10 that can be used to selectively generate a mod-hop free, continuously wavelength tunable output light 12 (illustrated in FIG. 1B) over a wavelength range supported by a gain media 16. The simplified illustration of the laser source 10 in FIG. 1A only illustrates the gain media 16, a cavity collimator 18, a wavelength dependent ("WD") feedback assembly 28, and an optical output coupler 36F that cooperate to generate the wavelength selectable, output light 12. In certain embodiments, the WD feedback assembly 28 includes a diffraction grating 30 having a grating face surface 42A that is in a grating plane 42B. The grating 30 cooperates with the gain media 16 and the cavity collimator 18 to define an external cavity 32 for the laser source 10.

As an overview, the present invention teaches that a unique pivot axis 33 exists about which the diffraction grating 30 can be pivoted to move the diffraction grating 30 relative to the gain media 16 to continuously adjust the wavelength of the output light 12 over a certain range. As a result thereof, the laser source 10 can produce a mode hop free, continuously wavelength tunable output light 12. Stated in another fashion, the diffraction grating 30 can be precisely pivoted relative to the pivot axis 33 to achieve the desired wavelength of the output light 12 with narrow line width. Thus, the laser source 10 can be used to quickly and accurately generate any desired wavelength output light 12, or continuously changing the output wavelength without mode hop.

As provided herein, the cavity collimator 18 includes a collimator apex 18A located on a collimator surface 18B that faces away from the gain media 16. With the present design, light traveling between the collimator apex 18A and the optical output coupler 36F travels an apex/coupler physical length 52C and an effective apex/coupler group optical length 52A, and light exiting the cavity collimator 18 at the collimator apex 18A travels along an optical axis 51D. As used herein the term apex/coupler group optical length 52A shall mean the effective distance that any ray of light travels during movement in the external cavity 32 from the collimator apex 18A to the optical output coupler 36F. More specifically, the apex/coupler group optical length 52A takes in account the group index of refraction of all objects in the external cavity 32 that influence the movement of a ray in the external cavity 32. As provided in more detail below, the apex/coupler group optical length 52A is longer than the apex/coupler physical length 52C because the index of refraction of the gain media 16 and the cavity collimator 18 is less than one.

As provided herein, the unique pivot axis 33 is located approximately at an intersection of the grating plane 42B and a pivot plane 50. Further, as provided herein, the pivot plane 50 is normal to the optical axis 51D. Moreover, the pivot axis 50 is spaced apart from the collimator apex 18A a distance that is equal to the apex/coupler group optical length 52A. Stated in another fashion, any ray that travels from the collimator apex, through the gain media and hits the output coupler, then the optical distance this ray traveled is the number we are trying to determine to locate the pivot axis 33. The calculation of the apex/coupler group optical length 52A is described in more detail below.

A number of Figures include an orientation system that illustrates an X axis, a Y axis that is orthogonal to the X axis and a Z axis that is orthogonal to the X and Y axes. It should be noted that these axes can also be referred to as the first, second and third axes.

Figure 1B:
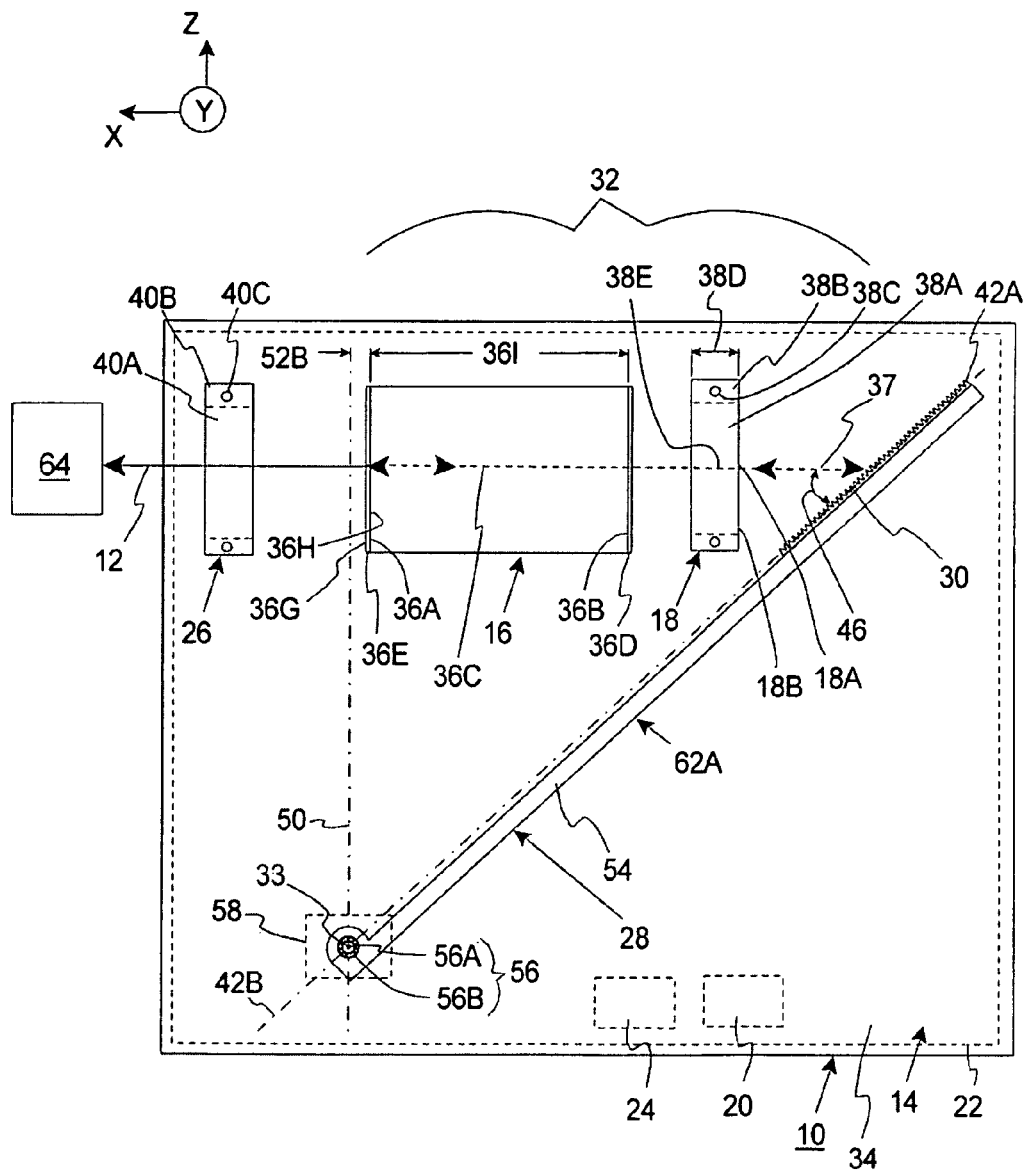
FIG. 1B is a more detailed illustration of a laser source having features of the present invention with the laser source lasing at a first wavelength.
Figure 1C:
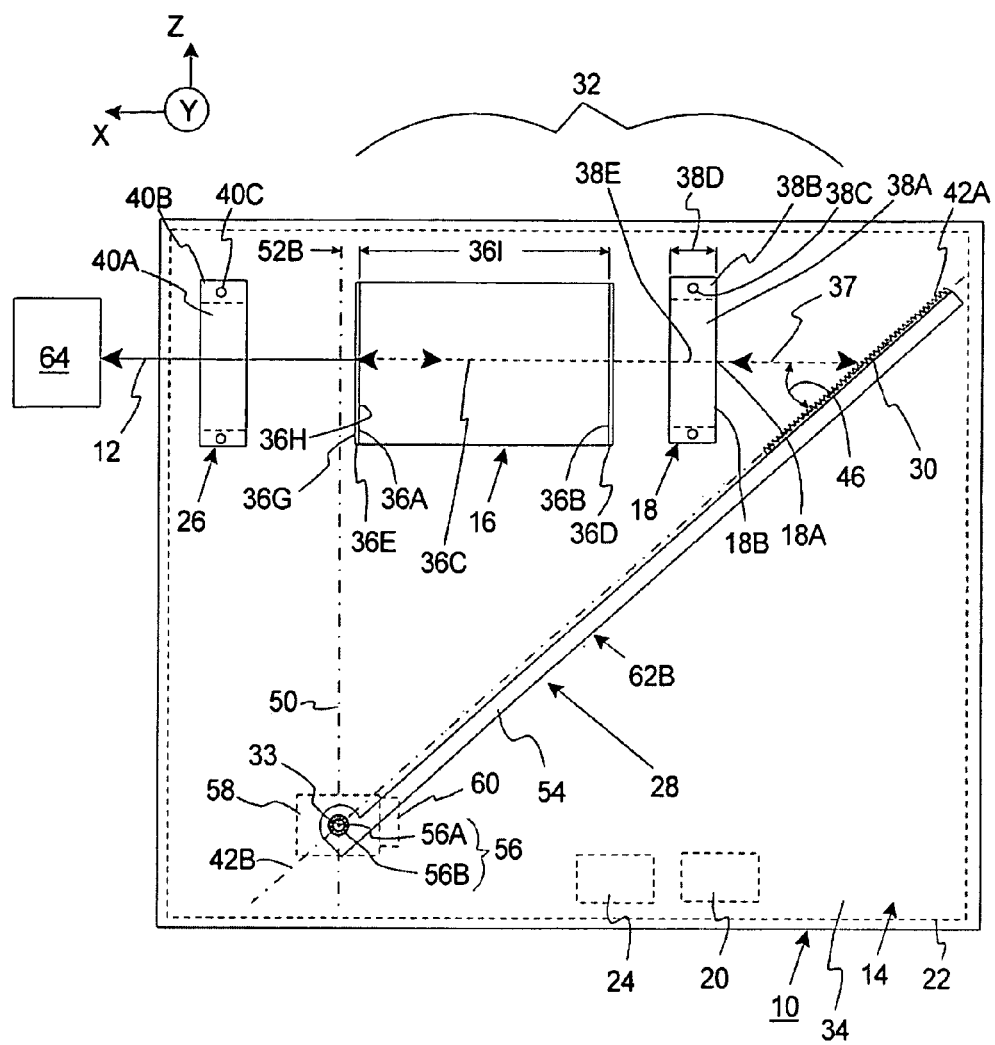
FIG. 1C is simplified top illustration of the laser source of FIG. 1B with the laser source lasing at a second wavelength.

FIGS. 1B and 1C illustrate a more detailed top view of the laser source 10. In these Figures, the laser source 10 includes a source frame 14, the gain media 16, the cavity collimator 18, an electrical current source 20 (illustrated in phantom), a temperature controller 22 (illustrated in phantom), a motion controller 24 (illustrated in phantom), an output optical assembly 26, and the wavelength dependent ("WD") feedback assembly 28 that cooperate to generate a wavelength selectable, narrow linewidth output light 12. The design of each of these components can be varied pursuant to the teachings provided herein. In should be noted that the laser source 10 can be designed with more or fewer components than described above.

In certain embodiments, the WD feedback assembly 28 includes the diffraction grating 30 that cooperates with the gain media 16 and the cavity collimator 38A to define the external cavity 32. Further, the present invention teaches that the unique pivot axis 33 exists about which the diffraction grating 30 can be pivoted to move the diffraction grating 30 relative to the gain media 16 to continuously adjust the wavelength of the output light 12 over a certain range. As a result thereof, the laser source 10 can produce a mode hop free, continuously wavelength tunable output light 12. Thus, the laser source 10 can be used to quickly and accurately generate any desired wavelength output 12, or continuously changing the output wavelength without mode hop.

Further, with the use of the pivot axis 33, the movement of the grating 30 is achieved with a relatively simple design that allows for a high production yield, and ultimately a relatively inexpensive laser source 10.

Moreover, in certain embodiments, because of the unique design disclosed herein, the laser source 10 can be extremely compact, hand-held, lightweight, stable, rugged, small, self-contained, and portable. For example, the laser source 10 can have dimensions of approximately 80 millimeters (height) by 80 millimeters (width) by 120 millimeters (length) (where length is taken along the propagation direction of the laser beam) or less.

In certain embodiments, the laser source 10 generates an output light 12 that is in the MIR range. In one embodiment, as used herein, the MIR range is approximately 2-20 microns. Wavelengths in the MIR range are particularly useful in absorption spectroscopy applications since many gases of interest have their fundamental vibrational modes in the MIR range and thus present strong, unique absorption signatures within the MIR range. Stated in another fashion, the laser source 10 can be controlled to generate output having any desired wavelength characterized by line width of 1-30 MHz within the output wavelength range and also can be controlled to continuously change the wavelength within the output wavelength range. Still alternatively, the laser source 10 can be designed to generate an arbitrary set of sequential, specific output wavelengths 12 that span the output range.

In alternative, non-exclusive embodiments, the grating 30 can be used to control the wavelength of output light 12 within the output wavelength range to within approximately 0.0003 nanometers. As a non-exclusive example, the grating 30 can be adjusted so that the laser source 10 has a fixed output light 26 of (i) 9.125 microns, (ii) 9.126 microns, (iii) 9.127 microns, (iv) 9.128 microns, (v) 9.129 microns, (vi) 9.130 microns, or any other specific wavelength in the adjustment range. With this design, the laser source 10 can be tuned so the output light 26 is at a precisely selected specific wavelength in the adjustment range, or alternatively the wavelength output can be continuously tune over an arbitrary part of, or the entire output wavelength range.

In certain embodiments, with the designs provided herein, the output light 12 has a narrow line width. In non-exclusive examples, the laser source 10 can be designed so that the line width of the output light 12 is less than approximately 0.001 nm. The spectral width of the output light 12 can be adjusted by adjusting the cavity parameters of the external cavity and stability of laser electrical current, temperature control and mechanical rigidity of the external cavity.

The source frame 14 supports at least some of the components of the laser source 10. In one embodiment, (i) the gain media 16, the cavity optical assembly 18, the output optical assembly 26, and the WD feedback assembly 28 are each secured to the source frame 14; and (ii) the source frame 14 maintains these components in precise mechanical alignment.

Additionally, in FIGS. 1B and 1C, the current source 20, the temperature controller 22, and the grating motion controller 24 are fixedly secured to the source frame 14. With this design, all of the critical components are secured to the source frame 14 in a stable manner, and the laser source 10 can be self-contained and extremely portable. Alternatively, for example, the current source 20, the temperature controller 22, and/or the motion controller 24 can be separate from and external to the source frame 14.

The design of the source frame 14 can be varied to achieve the design requirements of the laser source 10. In FIGS. 1B and 1C, the source frame 14 includes a mounting base 34, and a cover (not shown). Alternatively, for example, the source frame 14 can be designed without the cover and/or can have a configuration different from that illustrated in the Figures.

The mounting base 34 provides a rigid platform for fixedly mounting the gain media 16, the cavity collimator 18, the output optical assembly 26 and the WD feedback assembly 28. In one embodiment, the gain media 16, the cavity optical assembly 18, and the output optical assembly 26 are retained in a coaxial fashion.

In FIGS. 1B and 1C, the mounting base 34 is illustrated as being generally rectangular plate shaped. In one embodiment, the mounting base 34 is a monolithic structure that provides structural integrity to the laser source 10. Alternatively, the mounting base 34 can have a configuration that is different than that illustrated in the Figures.

In certain embodiments, the mounting base 34 is made of rigid material that has a relatively high thermal conductivity. In one non-exclusive embodiment, the mounting base 34 has a thermal conductivity of at least approximately 170 watts/meter K. With this design, in addition to rigidly supporting the components of the laser source 10, the mounting base 34 also readily transfers heat away from the gain media 16 to the temperature controller 22. For example, the mounting base 34 can be fabricated from a single, integral piece of copper, copper-tungsten or other material having a sufficiently high thermal conductivity. The one piece structure of the mounting base 34 maintains the fixed relationship of the components mounted thereto and contributes to the small size and portability of the laser source 10.

In certain embodiments, the overall size of the source frame 14 is quite small so that the laser source 10 is very portability. For example, the source frame 14 can have dimensions of approximately 10 centimeters (height) by 12 centimeters (width) by 20 centimeters (length) (where length is taken along the propagation direction of the laser beam) or less, and more preferably, the source frame 14 has dimensions of approximately 3 centimeters (height) by 4 centimeters (width) by 5 centimeters (length). Still alternatively, the source frame 14 can have dimensions of less than approximately 10 millimeters (height) by 25 millimeters (width) by 30 millimeters.

In one embodiment, the gain media 16 is a quantum cascade ("QC") gain media that is a unipolar semiconductor laser that includes a series of energy steps built into the material matrix while the crystal is being grown. With this design, electrons transmitted through the QC gain media emit one photon at each of the energy steps. In one embodiment, the QC gain media uses two different semiconductor materials such as InGaAs and AlInAs (grown on an InP or GaSb substrate for example) to form a series of potential wells and barriers for electron transitions. The thickness of these wells/barriers determines the wavelength characteristic of the QC gain media. Fabricating QC gain media of different thickness enables production of the laser having different output frequencies within the MIR range.

It should be noted that fine wavelength tuning of the output light 12 may be achieved by controlling the temperature of the gain media 16, such as by changing the DC bias current. Such temperature tuning is relatively narrow and may be used to vary the wavelength by approximately 1-5 GHz.

As used herein the term QC gain media shall also include Interband Cascade Lasers (ICL) in addition to Quantum Cascade type media. ICL lasers use a conduction-band to valence-band transition as in the traditional diode laser.

In FIGS. 1B and 1C, the gain media 16 includes (i) a first facet 36A that faces the output optical assembly 26 and the grating 30, and (ii) a second facet 36B that faces the cavity optical assembly 18. In this embodiment, the gain media 16 emits from both facets 36A, 36B. Further, in certain embodiments, the gain media 16 operates as a single transverse mode waveguide. Thus, light in the guide media 16 moves along a media longitudinal axis 36C of the gain media 16.

In one embodiment, the second facet 36B is coated with an anti-reflection ("AR") coating 36D and the first facet 36A is left uncoated or coated with a reflective coating 36E. The AR coating 36D removes coupled cavity effects which interfere with the diffraction grating wavelength selecting ability. Undesirable residual reflection off the second facet 36B interferes with feedback from the diffraction grating 30 and, if sufficiently large, will defeat the ability of the grating 30 to select one desired laser mode in the course of tuning. In contrast, the reflective coating 36E reflects at least some of the light that is directed at the first facet 36A from the gain media 16 back into the gain media 16. In one non-exclusive embodiment, the AR coating 36D can have a reflectivity of less than 1% percent, and the reflective coating 36E can have a reflectivity of between approximately 5-95 percent. In certain embodiments, it is preferred that the AR coating 36D can provide the lowest possible reflection off the second facet 36B across the complete tuning range.

In this embodiment, the reflective coating 36E acts as an output coupler 36F for the external cavity 32. Thus, in this embodiment, the output coupler 36F is positioned near, adjacent, and directly against to the gain media 16.

In this non-exclusive embodiment, the gain media 16 has a media length 36I along the media axis 36C (along the X axis in FIGS. 1B and 1C) of approximately 3 millimeters. Alternatively, the gain media 16 can have a media length 36I of between approximately 0.5 to 5 millimeters.

Additionally, the gain media 16 has an index of refraction that is different than the index of refraction for air. In alternative, non-exclusive examples, the gain media 16 can have an index of refraction of approximately 3 to 3.5.

Further, the gain media 16 can include one or more media fasteners (not shown) that fixedly secure the gain media 16 to the mounting base 34. For example, the media fastener can include one or more threaded bolts, an adhesive, one or more clamps, solder, or a weld.

In certain embodiments, desirable features for the gain media 16 include (i) operation at room temperature, (ii) broadest gain spectral range, (iii) single transversal mode waveguide or a waveguide preferentially supporting single transversal mode, (iv) antireflection multilayer dielectric coatings, integrated distributed feedback and photonic band gap structures for reflection suppression on the second facet 36A, (v) optimal reflectivity of the first facet, unobstructed optical access to both facets 36A, 36B, and (vii) shortest possible media length 36I.

A suitable gain media 16 can be purchased from numerous commercial suppliers.

In certain embodiments, the gain media 16 generates a relatively strong output light 12 and also generates quite a bit of heat if operated continuously. Accordingly, the temperature controller 22 can be an important component that is needed to remove the heat, thereby permitting long lived operation of the laser source 10 and consistent optical output power.

The intra-cavity collimator 18 is positioned between the gain media 16 and the grating 30, and collimates and focuses the light that passes between these components. For example, the cavity optical assembly 18 can include one or more cavity lenses 38A (one is illustrated in phantom), a lens mount 38B and a lens fastener 38C.

For example, the cavity lens 38A can be a single menisus, aspherical, lens that has an optical axis 38E and the collimator apex 18A that is located on the collimator surface 18B that faces the grating 30. In one embodiment, to achieve the desired small size and portability, the cavity lens 38A has a relatively small diameter. In alternative, non-exclusive embodiments, the cavity lens 38A has a diameter of less than approximately 5 or 10 millimeters, and a focal length of approximately 0.3 to 5 mm, and any fractional values thereof. The cavity lens 38A can be made of an IR transparent material that is selected from the group of Ge, ZnSe, ZnS Si, CaF, BaF or chalcogenide glass. However, other materials may also be utilized. The cavity lens 38A may be made using a diamond turning or molding technique. The cavity lens 38A can be designed to have a relatively large numerical aperture (NA). For example, the cavity lens 38A can have a numerical aperture of at least approximately 0.6-0.9. The NA may be approximated by the lens diameter divided by twice the focal length. Thus, for example, a lens diameter of 5 mm having a NA of 0.8 would have a focal length of approximately 3.1 mm.

Moreover, the cavity lens 38A can be designed to have (i) diffraction limited collimation across the full numerical aperture, (ii) applanatic performance, (iii) low dispersion or dispersion compensation over the tunable range, and/or (iv) desired beam size upon collimation, to efficiently illuminate diffraction grating 30 for highest efficiency and spectrally resolving power.

Additionally, the cavity lens 38A has an index of refraction that is different than the index of refraction for air. In alternative, non-exclusive examples, the cavity lens 38A can have an index of refraction of approximately 2.5 (for Zinc Selenium "ZnSe"), 3.4 (for Silicon "Si"), 4.01 (for Germanium "Ge"), or 3.3 (for Gallium Arsenic "GaAs").

Moreover, the cavity lens 38A has a lens thickness 38D along the optical axis 38E. For example, the lens thickness can be between approximately 0.5 to 4 millimeters. In one, non-exclusive embodiment, the lens thickness 38D is approximately 2.2 millimeters. In certain embodiments, the shortest optical thickness of the cavity collimator 38A is preferred.

Additionally, one or both sides of the cavity lens 38A can be coated with a spectrally broadband, high efficiency AR coating.

The lens mount 38B fixedly and rigidly retains the cavity lens 38A. For example, the lens mount 38B can be a rigid bracket. The lens fastener 38C fixedly and rigidly secures the lens mount 38B and the cavity lens 38A to the mounting base 38A. For example, the lens fastener 38C can include one or more threaded bolts, an adhesive, one or more clamps, solder, or a weld.

The current source 20 provides electrical power for the gain media 16, the motion controller 24, and the temperature controller 22. In the Figures, the current source 20 is a battery that is secured to the source frame 14. For example, the battery can be nickel metal hydrate. Alternatively, the power source 20 can be external to the source frame 14. For example, the power source 20 can be an external battery or a power outlet.

The temperature controller 22 can be used to control the temperature of the gain media 16, the mounting base 34, and/or one or more of the other components of the laser source 10. Further, the temperature controller 22 can be used to maintain the relative position of the gain media 16, the optical assemblies 18, 26 and the WD feedback assembly 28.

In one embodiment, the temperature controller 22 includes a thermoelectric cooler (not shown) and a temperature sensor (not shown). The thermoelectric cooler may be controlled to effect cooling or heating depending on the polarity of the drive current thereto. In the Figures, the temperature controller 22 is fixed to the bottom of the mounting base 34 so that the thermoelectric cooler is in direct thermal communication with the mounting base 34, and so that the thermoelectric cooler can provide additional rigidity and support to the mounting base 34. In one embodiment, the top of the thermoelectric cooler is approximately the same size as the bottom surface of the mounting base 34. This promotes good heat transfer between the thermoelectric cooler and the mounting base 34, and maximizes the support for the mounting base 34 provided by the thermoelectric cooler. The thermoelectric cooler can be fixedly secured to the mounting base 34 with bolts, epoxy, welding, solder or other suitable means.

Alternatively, an intermediate plate may be attached between the thermoelectric cooler and the mounting base 34.

The temperature sensor provides temperature information that can be used to control the operation of the thermoelectric cooler so that the thermoelectric cooler can maintain the desired temperature of the laser source 10. The temperature sensor may comprise an encapsulated integrated circuit with a thermistor as the temperature sensor active component. The temperature sensor can be positioned on the mounting base 34 near the gain media 16 and can be used to monitor the temperature of the gain media 16.

Additionally, or alternatively, the source frame 14 can be mounted to a heat sink (not shown) inside a larger housing (not shown) which may also contain additional equipment including cooling fans and vents to further remove the heat generated by the operation of the laser source 10.

The laser/motion controller 24 controls the operation of the laser source 10. For example, the laser/motion controller 24 can include a processor that controls gain media 16 by controlling the electron injection current. In the Figures, the laser/motion controller 24 is rigidly and fixedly mounted to the source frame 14 so that the laser source 10 is portable and rugged. Alternatively, for example, the laser/motion controller 24 can be external to the source frame 14.

The output collimator 26 is spaced apart from the gain media 16, and the output optical assembly 26 collimates the light that exits the first facet 36B of the gain media 16. For example, the output optical assembly 26 can include one or more lens 40A (one is illustrated in phantom), a lens mount 40B and a lens fastener 40C.

The lens 40A can be somewhat similar in design to the cavity lens 38A of the cavity collimator 18. The lens mount 40B fixedly and rigidly retains the lens 40A. For example, the lens mount 40B can be a rigid bracket. The lens fastener 40C fixedly and rigidly secures the lens mount 40B and the lens 40A to the mounting base 34. For example, the lens fastener 40C can include one or more threaded bolts, an adhesive, one or more clamps, solder, or a weld.

The grating 30 reflects the light back to the cavity lens 38A and the gain media 16, and the grating 30 is used to precisely adjust the lasing frequency of the external cavity 32 and the wavelength of the output light 12. Stated in another fashion, the grating 30 is used to feedback to the gain media 16 a relatively narrow band wavelength which is then amplified in the gain media 16. In this manner, the output light 12 may be tuned and set to a desired fixed wavelength with the grating 30 without adjusting the gain media 16. Thus, in the external cavity 32 arrangements disclosed herein, the grating 30 dictates what laser mode will experience the most gain and thus define the wavelength of the output light 12.

As provided herein, the diffraction grating 30 has wavelength dependent reflectivity. In Figures, the diffraction grating 30 is spaced apart from the gain media 16 and cooperates with the gain media 16 to form the external cavity 32. In this embodiment, the external cavity 32 extends from the optical output coupler 36F to the diffraction grating 30. This configuration is commonly known as a Littrow configuration.

The term external cavity 32 is utilized to designate that the diffraction grating 30 is positioned outside of the gain media 16. In the Figures, the external cavity 32 is not external to the source frame 14 in which the gain media 16 is contained. Instead, in FIGS. 1B and 1C, the external cavity 32 is contained within the source frame 14.

The present invention provides a unique arrangement for precisely adjusting the lasing frequency of the external cavity 32 and the wavelength of the output light 12. With this design, the precise movement of the diffraction grating 30 relative to the cavity collimator 38A and the gain media 16 adjusts the lasing wavelength and the wavelength of the output light 12 without mode hop.

The diffraction grating 30 can include a glass or polished metal grating face surface 42A having a large number of very fine parallel grooves or slits that have a grating period ("GP") 42C. With this design, movement of the grating face surface 42A relative to the gain media 16 and the incident beam 37 changes the angle of incidence 46 of the incident beam 37 onto the grating face surface 42A and the wavelength of the light in the external cavity 32. Stated in another fashion, the grating face surface 42A is selectively movable relative to the gain media 16 to precisely adjust the lasing wavelength of the external cavity 32. In this embodiment, changing the incidence angle 46 serves to preferentially select a single wavelength which is the first order diffracted light from the grating face surface 42A. This light is diffracted back onto the same path as the incident beam 37 to thereby tune the external cavity 32 to the diffracted wavelength. The diffracted laser light is received by the gain media 16 to provide stimulated laser emission thereby resonating the gain media 16 with the grating selected wavelength.

Desirable features of the diffraction grating 30 include (i) highest efficiency in working order across broadest spectral range, (ii) diffraction limited flatness across working area, and/or (iii) a physical size which guaranties that no portion of collimated light 37 from the cavity collimator 38A will miss the working area as the grating 30 is moved in a manner prescribed in the present invention.

As provided herein, the grating face surface 42A is positioned in a grating plane 42B. Further, the grating 30 is generally rectangular plate shaped with the plurality of grooves. Alternatively, the grating 30 can have a different configuration than that illustrated in FIGS. 1B and 1C.

Continuous wavelength tuning is accomplished by proper motion of the diffraction grating 30 with respect to the gain media 16 and the cavity collimator 38A. As an overview, the present invention teaches that the proper motion of the grating 30 can be realized either by (i) rotation of the grating 30 with respect to the properly selected pivot axis 33, or (ii) rotation around the properly selected pivot axis 33 accompanied by the arbitrary motion of the pivot axis 33 in a pivot plane 50. As disclosed herein, the pivot axis 33 is located at the intersection of the pivot plane 50 and the grating plane 42B.

Figure 1D:
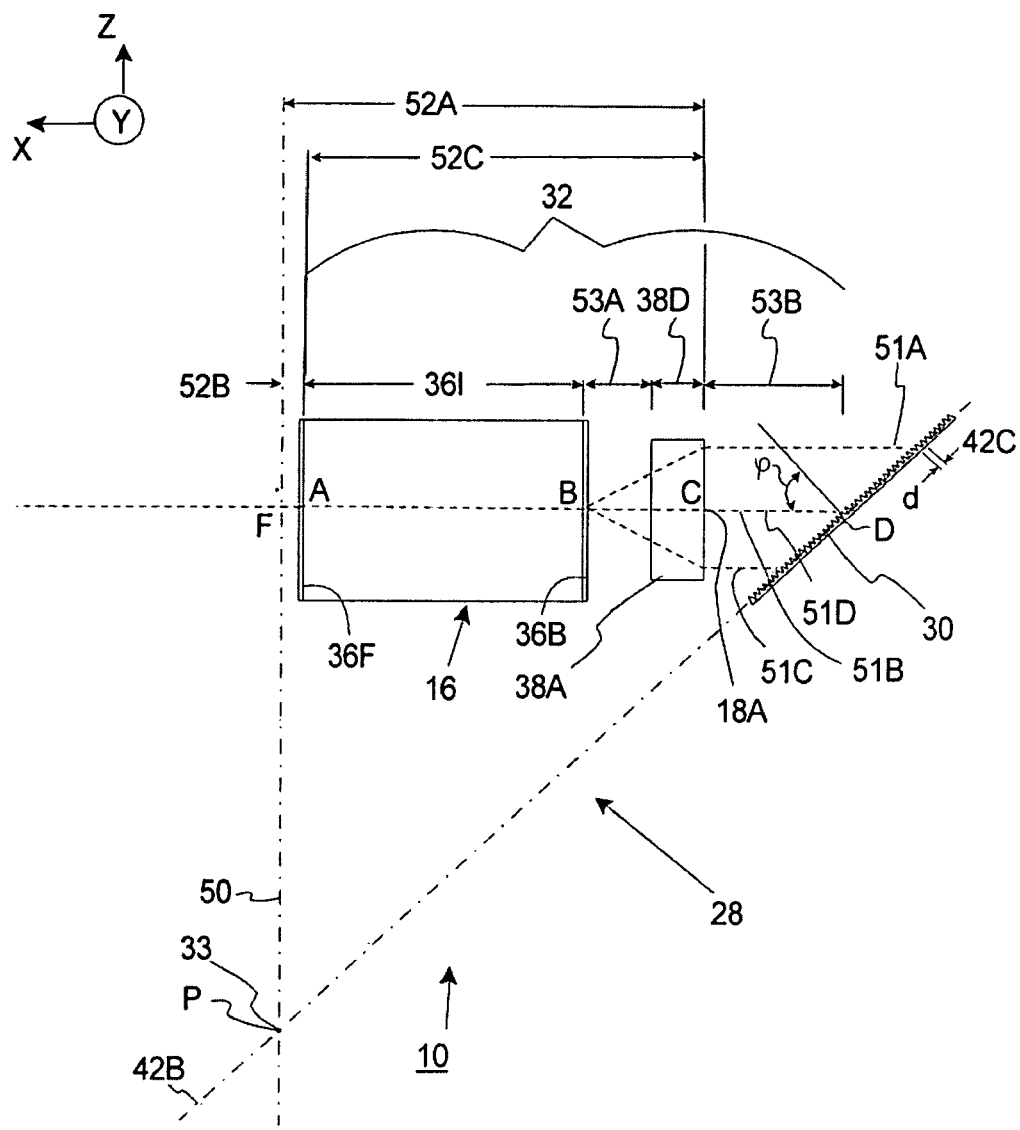
FIG. 1D is a simplified illustration of a portion of the laser source of FIGS. 1B and 1C.

FIG. 1D is a simplified illustration of a portion of the laser source 10 of FIGS. 1B and 1C. FIG. 1D is useful for illustrating how to determine (i) the location of the pivot plane 50, and (ii) the location of the pivot axis 33 (also represented a P in FIG. 1D).

During operation of the laser source 10, a plurality of light rays 51A-51C travel between the gain media 16, the cavity collimator 38A and the grating 30. FIG. 1D illustrates only three representative light rays 51A-51C that travel in the external cavity 32 in this area. It should be noted that the rays 51A-51C that travel between the cavity collimator 38A and the grating 30 and that exit from the collimator apex 18A are directed along an optical axis 51D.

In FIG. 1D, the travel of ray 51B in the external cavity 32 is highlighted with the letters A, B, C, D. More specifically, in FIG. 1D, (i) D represents the point where the ray 51B is incident on or reflected off of the grating 30, (ii) C represents the point where the ray 51B exits the cavity collimator 38A (at the collimator apex 18A) towards the grating 30 or enters the cavity collimator 38A (at the collimator apex 18A) from the grating 30, (iii) B represents the point wherein the ray 51B exits or enters the second facet 36B of the gain media 16, and (iv) A represents the point where the ray 51B is incident on or reflects off of the optical output coupler 36F.

In this example, the ray segment CD is on the optical axis 51D, ray segment AB represents the single transversal mode of the light in the gain media 16, and ray segment B-C-D is an arbitrary ray emerging from the gain media 16. Further, in FIG. 1D, dashed line DF represents an imaginary straight line that is coaxial with and passes through the optical axis 51D. Moreover, in FIG. 1D, PD represents the grating plane 42B. Additionally, in FIG. 1D, the grading period 42C is also represented by the letter d. Further, the optical axis 51D is at an angle of φ relative to normal to the grating plane 42B.

As provided herein, in one embodiment, the pivot plane 50 is normal to the optical axis 51D and the pivot plane 50 is located outside the external cavity 32 near and spaced apart from the optical output coupler 36F. Further, the pivot plane 50 is spaced apart the apex/coupler group optical length 52A from the collimator apex 18A along the optical axis 51D. Stated in another fashion, the pivot plane 50 is spaced apart a separation distance 52B from the optical output coupler 36F and the separation distance 52B is equal to the apex/coupler group optical length 52A minus an apex/coupler physical length 52C. In FIG. 1D, the letter F represents the intersection between the pivot plane 50 and the optical axis 51D.

As provided above, the term apex/coupler group optical length 52A shall mean the effective distance that any ray of light travels during movement in the external cavity 32 from the collimator apex 18A to the optical output coupler 36F. More specifically, the apex/coupler group optical length 52A takes in account the index of refraction of all objects in the external cavity 32 that influence the movement of a ray 51A-51C in the external cavity 32. The apex/coupler group optical length 52A can be expressed as follows in Equation 1:

$$L\_opt = \Sigma n_i L_i$$

Where L_opt is the apex/coupler group optical length 52A, i is each portion of the external cavity, n is the group index of refraction of each portion of the external cavity, and L is the length of each portion of the external cavity.

In the embodiment illustrated in FIG. 1D, the apex/coupler group optical length 52A is the effective length that a particular ray travels in the external cavity 32 between the collimator apex 18A and the output coupler 36F and is equal to the apex/coupler physical length 52C multiplied by the index of refraction in which the ray travels. If there are multiple different objects in the external cavity 32, then the apex/coupler group optical length 52A is the sum of each element length multiplied by its group index of refraction. For example, in FIG. 1D, the apex/coupler group optical length 52A is the sum of (i) the media length 36I multiplied by the group index of refraction of the gain media 16, (ii) a first fluid space length 53A multiplied by the group index of refraction of the fluid, and (iii) the lens thickness 38D multiplied by the group index of refraction of the cavity lens 38A. It should be noted, that in this embodiment, because the ray travels in air between the collimator apex 18A and the grating 30 (the area represented by 53B), the physical and optical length are the same for this area. In this example, the apex/coupler group optical length 52A can be expressed as follows in Equation 2:

$$L\_opt = (L\_\text{gain media} \cdot n\_\text{gain media}) + (L\_\text{1fluid space} \cdot n\_\text{fluid}) + (L\_\text{optical lens} \cdot n\_\text{collimator}).$$

In Equation 2, L is length, and n is the group index of refraction. For air, the index of refraction is 1. Thus, for the laser source 10 illustrated in FIG. 1D, the group index of refraction of the gain media (n_gain media) and the group index of refraction of the cavity collimator 38A (n_collimator) influence the rays 51A-51C that travel in the external cavity 32 and the location of the resulting pivot axis P. Further, as provided herein, the apex/coupler group optical length 52A is the distance between F and C in FIG. 1D.

Further, as used herein, the term apex/coupler physical length 52C shall mean the actual physical length that any ray of light travels during movement in the external cavity 32 from the optical output coupler 36F to the collimator apex 18A (Path ABC in FIG. 1D). For example, in the embodiment illustrated in FIG. 1D, the apex/coupler length 52C is the length that a particular ray travels and is the sum of (i) the media length 36I, (ii) the first fluid space length 53A, and (iii) the lens thickness 38D.

Basically, the apex/coupler physical length 52C can be calculated similar to the apex/coupler group optical length 52A except the index of refraction for each segment is assumed to be equal to 1. Thus, in this example, the apex/coupler physical length 52C can be expressed as follows in Equation 5:

$$L\_phy = \Sigma(L\_\text{gain media} \cdot 1) + (L\_\text{1fluid space} \cdot 1) + (L\_\text{optical lens} \cdot 1)$$

or $$L\_phy = \Sigma(L\_\text{gain media}) + (L\_\text{1fluid space}) + (L\_\text{optical lens}).$$

It should be noted that the apex/coupler group optical length 52A is always greater than the apex/coupler physical length 52C by the separation distance 52B.

In one simplified example, if the gain media 16 has a media length of 3 millimeters and a substantially constant index of refraction of 3.3 over the desired wavelengths, and the cavity collimator has a lens thickness 38D of 2.2 millimeters and a substantially constant index of refraction of 4.1, then the separation distance 52B can be calculated as follows:

$$\Delta = L\_opt - L\_phy$$

$$= (L\_\text{gain media} \cdot (n\_\text{gain media} - 1)) + (L\_\text{optical lens} \cdot (n\_\text{collimator} - 1))$$

$$= (3 \cdot (3.3-1)) + (2.2 \cdot (4.1-1))$$

$$= 13.72 \text{ millimeters}$$

In this example, the pivot plane 50 is spaced apart from the optical output coupler 13.72 millimeters.

It should be noted that in the embodiment of the laser source 10 illustrated in FIGS. 1A-1D, the optical axis 51D, the optical axis 38E and the media axis 36C are all aligned along the X axis and these axes 51D, 38E, 36C are coaxial. In this example, the pivot plane 50 is normal to all of these axes 51D, 38E, 36C.

Referring back to FIGS. 1B and 1C, in addition to the diffraction grating 30, the WD feedback assembly 28 includes a grating beam 54, a beam attacher 56 and a beam actuator 58 that cooperate to retain the diffraction grating 30 and precisely move and position the diffraction grating 30 about the pivot axis 33. The design of each of these components can vary pursuant to the teachings provided herein In one embodiment, the grating beam 54 is a generally rigid, straight beam that includes a distal beam end 54A that retains the grating 30 and a proximal beam end 54B that is secured to the mounting base 34.

The beam attacher 56 secures the proximal beam end 54B of the grating beam 54 to the mounting base 34 and allows the grating beam 54 and the grating 30 to effectively pivot relative to the mounting base 34 about the pivot axis 33. FIGS. 1B and 1C illustrate a first embodiment of the beam attacher 56. In this embodiment, the beam attacher 56 includes an attacher pin 56A that is fixedly secured to the mounting base 34 and an attacher bearing 56B (e.g. a ball bearing) that pivotable attaches the grating beam 54 to the mounting base 34. Further, in this embodiment, the attacher bearing 56B is positioned on and pivots about the pivot axis 33.

The beam actuator 58 moves the grating beam 54 so that the grating 30 effectively rotates about the pivot axis 33. The design of the beam actuator 58 can vary pursuant to the teachings provided herein. In one embodiment, the beam actuator 58 includes an electric actuator that precisely rotates the grating beam 54 about the pivot axis 33. With this design, the laser electronic controller 24 can be used to precisely control the beam actuator 58 to precisely select the desired wavelength of the output light 12 generated by the laser source 10. The type of actuator and the attachment of the actuator to the grating beam can vary greatly. Non-exclusive examples of suitable actuators include a rotary motor, a stepper motor, a piezoelectric actuator, or a voice coil motor. Alternatively, the beam actuator 58 can be a manually operated device that is used to precisely pivot the grating beam 54. In one non-exclusive embodiment, the beam actuator 58 rotates the grating 30 relative to the pivot axis 33 between approximately 30 and 70 degrees during operation of the laser source 10.

Additionally, the laser source 10 can include a measurement device 60 that monitors the rotational position of the grating beam 54 and/or the grating 30. For example, the measurement device 60 can include an optical encoder, a strain gauge, or a capacitive gauge.

Comparing FIG. 1B to 1C, the rotational position of the grating beam 54 and the grating 30 are different in these Figures. More specifically, FIG. 1B illustrates the grating beam 54 and the grating 30 at a first rotational position 62A relative to the pivot axis 33, and FIG. 1C illustrates the grating beam 54 and the grating 30 at a second rotational position 62A relative to the pivot axis 33. In the first rotational position 62A, the angle of incidence 46 has a first value and the laser 10 generates an output light 12 having a first center wavelength; and in the second rotational position 62A, the angle of incidence 46 has a second value that is different than the first value and the laser 10 generates an output light 12 having a second center wavelength that is different than the first center wavelength. It should be noted that with the designs provided herein, the grating 30 can be rotated to numerous other rotational positions so that the laser source 10 is continuous wavelength tunable. Stated another way, because of the unique positioning of the pivot axis 33, pivoting of the grating 30 between the rotation positions results in continuous tuning of the output light 12 without mode hops. Further, because the tuning is accomplished with pure, relatively simple rotation, the laser source 10 can be manufactured relatively simply and inexpensively.

In this embodiment, during manufacturing of the laser source 10, the various components can be fixedly attached to the mounting base 34. Next, the laser source 10 can be turned on, and a wavelength measurement device 62 can be used to precisely measure the wavelength of the output light 12 and calibrate the measurement device 60. Subsequently, the beam actuator 58 can be used to rotate the grating 30 while calibrating the measurement device 60.

Importantly, as provided herein, the pivot axis 33 can be moved along the pivot plane 50 without causing mod hop in the laser source 10. Thus, movement of the pivot axis 33 along the pivot plane 50 can also be referred to as penalty free motion (along the Z axis in FIGS. 1B and 1C). As a result thereof, tolerances along the pivot plane 50 are not required to be as strict.

In contrast, movement of the pivot axis 33 perpendicular to the pivot plane 50 causes the operation of the laser source 10 to change. Thus, motion of the pivot axis 33 perpendicular to the pivot plane 50 can also be referred to a penalty motion (along the X axis in FIGS. 1B and 1C).

As provided herein, it is difficult in precisely calculating the exact index of refraction for the gain media 16 and the cavity collimator 38A for the wavelengths of the laser source 10. As a result thereof, the exact value of the apex/coupler group optical length 52A can not calculated to extreme accuracy. Further, manufacturing tolerances of the components of the laser source 10 can influence the exact value of the apex/coupler group optical length 52A. As a result thereof, in certain embodiments, the present invention uses only an approximate calculation of the apex/coupler group optical length 52A and the approximate position of the pivot axis 33. Subsequently, during manufacturing, the laser source 10 can be turned on and the position of the pivot axis 33 can be moved along the penalty motion (along the X axis in FIGS. 1B and 1C) until the laser source 10 operates mode hop free. For example, in one non-exclusive embodiment, the pivot axis 33 can be adjusted between approximately 3 mm along the penalty motion until mode hop free operation is achieved. It should be noted that this adjustment is necessary in practical embodiment to compensate for the inaccuracies in calculating the apex/coupler group optical length 52A.

Figure 2:
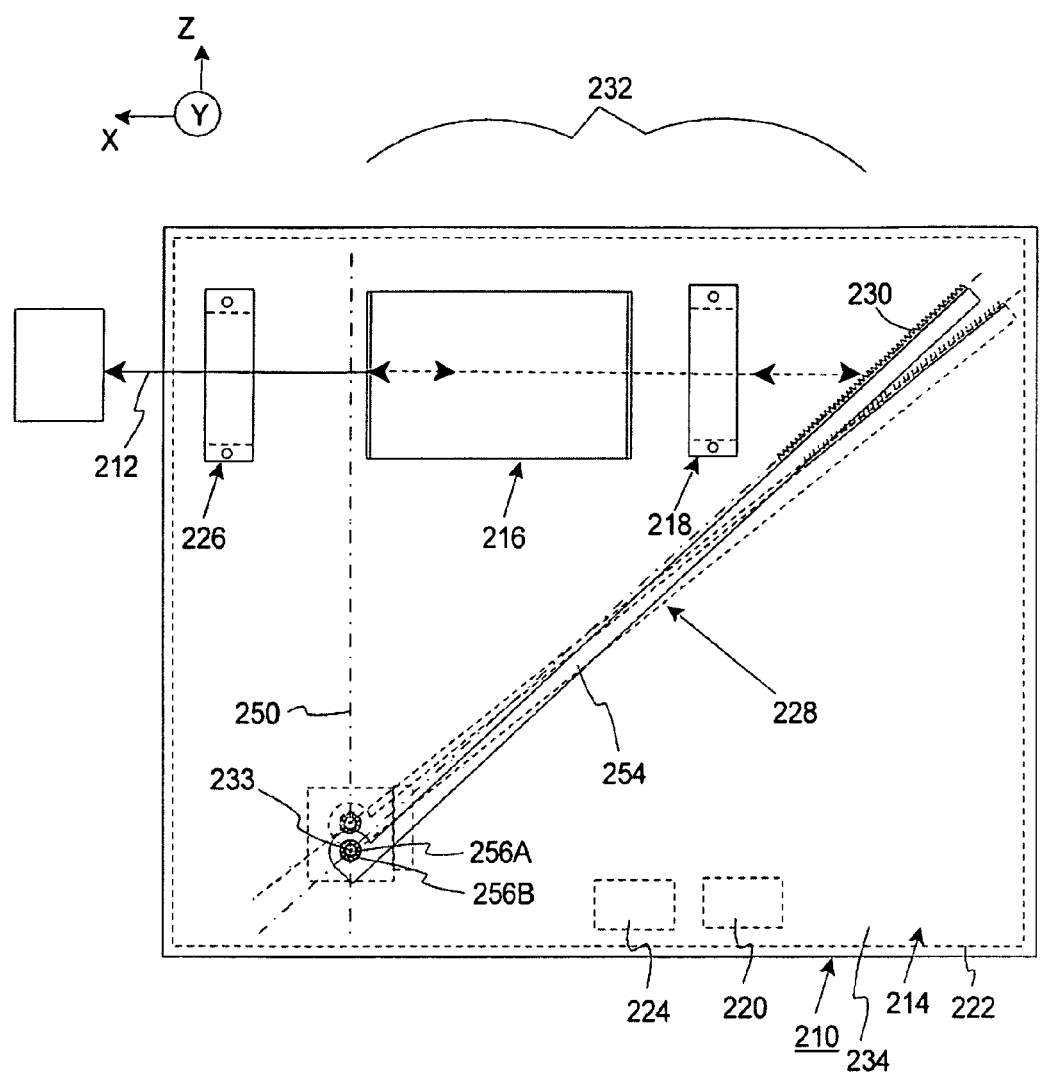
FIG. 2 is simplified top illustration of another embodiment of a laser source of having features of the present invention.

FIG. 2 illustrates a simplified top view of another embodiment of the laser source 210 that selectively generates a mod-hop free, continuously wavelength tunable output light 212 over an output range. In this embodiment, the laser source 210 includes a source frame 214, a gain media 216, a cavity collimator 218, a power source 220 (illustrated in phantom), a temperature controller 222 (illustrated in phantom), a laser electronic controller 224 (illustrated in phantom), and an output collimator 226 that are somewhat similar to the corresponding components described above and illustrated in FIGS. 1A and 1B, and a WD feedback assembly 228 that is slightly different.

More specifically, in this embodiment, the beam actuator 258 is adapted to move the attacher pin 256A, the attacher bearing 256B and the grating beam 254 linearly along the pivot plane 250 and pivot the grating beam 254 about the pivot axis 233. FIG. 2 illustrates these components at two different positions, with one of the positions being in phantom.

In this embodiment, the present invention teaches that the unique pivot axis 233 exists along the pivot plane 250. Thus, the diffraction grating 230 can be pivoted about the pivot axis 233, and pivot axis 233 moved linearly along the pivot plane 250 to move the diffraction grating 230 relative to the gain media 216 to continuously adjust the lasing frequency of the external cavity 232 and the wavelength of the output light 212. Thus, this embodiment uses both translation and rotation. As a result thereof, the laser source 210 can produce a mode hop free, continuously tunable output light 212. Thus, the laser source 210 can be used to quickly and accurately generate a number of alternative wavelength output lights 212 without mode hop.

Further, with the use of a pivot axis 33, the movement of the grating 30 is achieved with a relatively simple design that allows for a high production yield, and ultimately a relatively inexpensive to make laser source 10.

Figure 3:
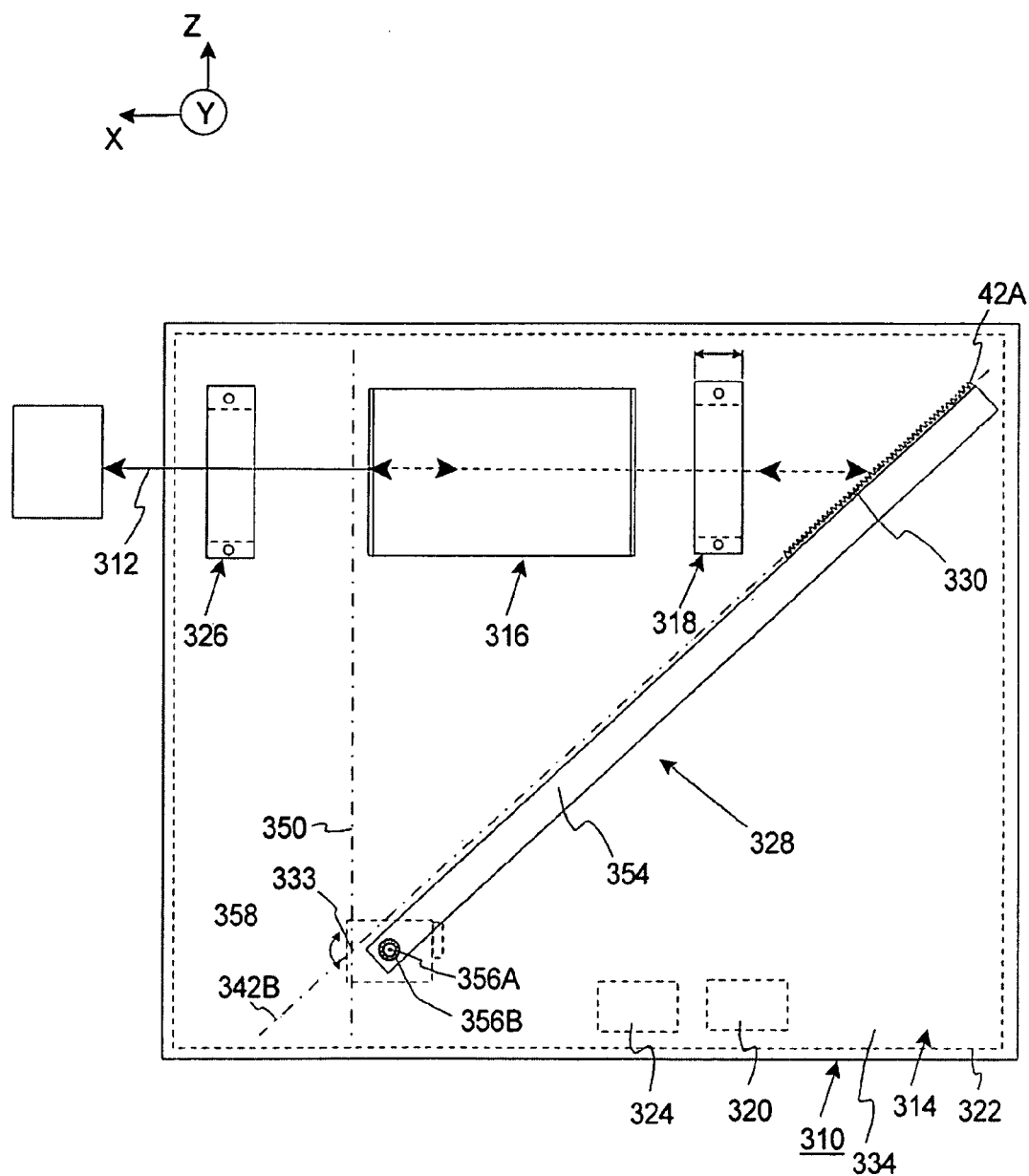
FIG. 3 is simplified top illustration of still another embodiment of a laser source having features of the present invention.

FIG. 3 illustrate a simplified top view of yet another embodiment of the laser source 310 that selectively generates a mod-hop free, continuously wavelength tunable output light 312 over an output range. In this embodiment, the laser source 310 includes a source frame 314, a gain media 316, a cavity collimator 318, a power source 320 (illustrated in phantom), a temperature controller 322 (illustrated in phantom), a laser electronic controller 324 (illustrated in phantom), and an output collimator 326 that are somewhat similar to the corresponding components described above and illustrated in FIGS. 1B and 1C, and a WD feedback assembly 328 that is slightly different.

More specifically, in this embodiment, the beam attacher 356 includes an attacher pin 356A that is not located on the pivot axis 333 and an attacher bearing 356B that does not encircle the pivot axis 333. However, in this embodiment, these components are situated and the grating beam 354 is designed so that the grating 330 and the grating beam 354 effectively pivot about the pivot axis 333 for at least the relatively small rotation range needed to adjust the wavelengths of the laser source 310. In this embodiment, the trajectory deviation resulting from improper location of the attacher bearing 356B not being located in the grating plane 342B does not forbid mode hop free tuning because the unwanted motion occurs in the penalty free plane.

In this embodiment, the present invention again teaches that the unique pivot axis 333 exists along the pivot plane 350 and the grating plane 342B. Thus, the diffraction grating 330 can be pivoted to move the diffraction grating 330 relative to the gain media 316 to continuously adjust the lasing frequency of the external cavity 332 and the wavelength of the output light 312. As a result thereof, the laser source 310 can produce a mode hop free, continuously tunable output light 312.

Further, with the use of a pivot axis 333, the movement of the grating 330 is achieved with a relatively simple design that allows for a high production yield, and ultimately a relatively inexpensive to make laser source 10.

Figure 4:
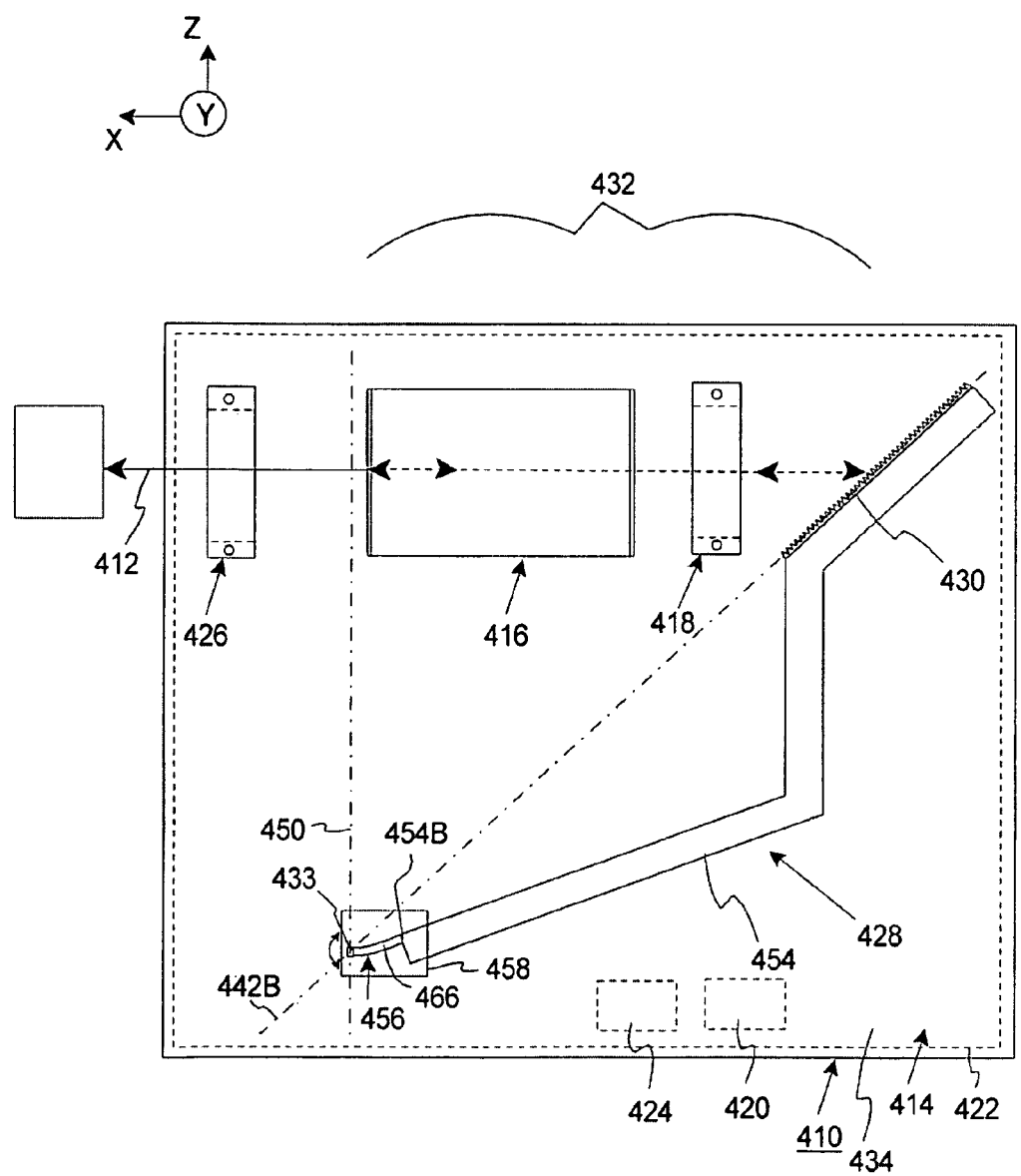
FIG. 4 is simplified top illustration of yet another embodiment of a laser source having features of the present invention.

FIG. 4 illustrate a simplified top view of still another embodiment of the laser source 410 that selectively generates a mod-hop free, continuously wavelength tunable output light 412 over an output range. In this embodiment, the laser source 410 includes a source frame 414, a gain media 416, a cavity collimator 418, a power source 420 (illustrated in phantom), a temperature controller 422 (illustrated in phantom), a laser electronic controller 424 (illustrated in phantom), and an output collimator 426 that are somewhat similar to the corresponding components described above and illustrated in FIGS. 1B and 1C, and a WD feedback assembly 428 that is slightly different.

More specifically, in this embodiment, the beam attacher 456 includes a flexure 466 that attaches the proximal beam end 454B of the grating beam 454 to the mounting base 434 near the pivot axis 433 and allows the grating 430 and the grating beam 454 to effectively pivot about the pivot axis 433 for at least the relatively small rotation range needed to adjust the wavelengths of the laser source 410. With the design illustrated in FIG. 4, the flexure 466 cantilevers as pivotal point mechanism, and trajectory deviation results from intrinsic deficiency of said pivotal mechanism. However, in this design, most of the unwanted motion that is not about the pivot axis 433 but is along the penalty free motion of the Z axis. For example, the flexure 466 can be a flexible beam.

In this embodiment, the present invention again teaches that the unique pivot axis 433 exists along the pivot plane 450 and the grating plane 442B. Thus, the diffraction grating 430 can be pivoted to move the diffraction grating 430 relative to the gain media 416 to continuously adjust the lasing frequency of the external cavity 432 and the wavelength of the output light 412. As a result thereof, the laser source 410 can produce a mode hop free, continuously tunable output light 412. Further, in FIG. 4, the beam actuator 458 can be used to move the grating beam 454.

Figure 5:
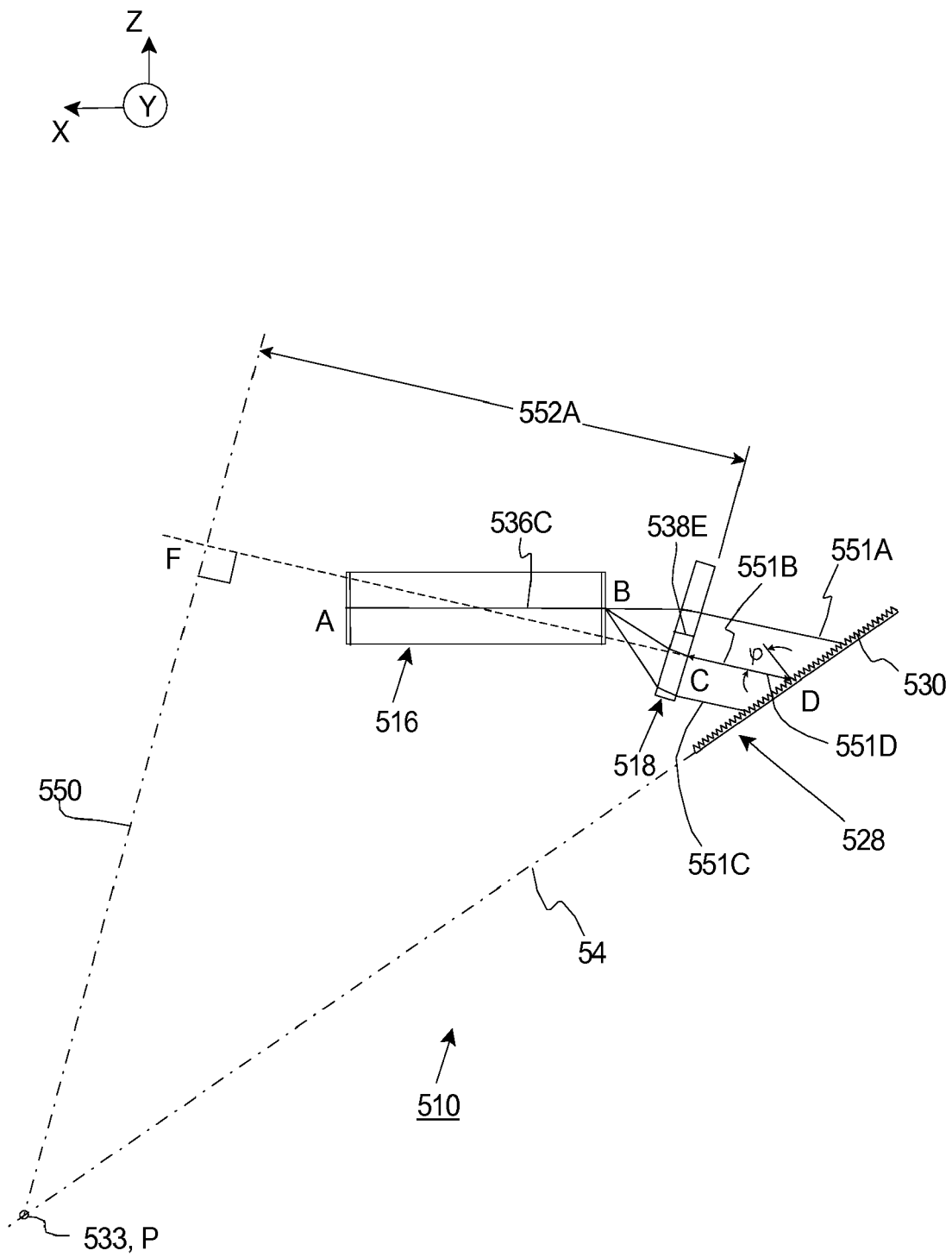
FIG. 5 is a simplified illustration of a portion of still another embodiment of a laser source having features of the present invention.

FIG. 5 illustrates a simplified view of a portion of another embodiment of the laser source 510 that selectively generates a mod-hop free, continuously wavelength tunable output light 512 over an output range. In this embodiment, only the gain media 516, the cavity collimator 518, and a portion of the WD feedback assembly 528 are illustrated. These components are similar to the corresponding components described above and illustrated in FIGS. 1B and 1C. However, in this embodiment, these components have a different orientation than those components.

More specifically, in this embodiment, the optical axis 551D, the optical axis 538E and the media axis 536C are not aligned and are not coaxial. As a result thereof, the pivot plane 550 is perpendicular to the optical axis 551D, and the pivot plane 550 is not perpendicular with the optical axis 538E and the media axis 536C.

In FIG. 5, rays 551A-551C, and points A, B, C, D of ray 551B are illustrated. Moreover, point F again represents the intersection of the optical axis 551D and the pivot plane 550 while point P again represents the pivot axis 533 for the grating 530.

In this embodiment, the apex/coupler group optical length 552A (line C-F) can be calculated with the following formula:

$$L\_opt = (L\_\text{gain media} \cdot n\_\text{gain media}) + (L\_\text{1 fluid space} \cdot n\_\text{fluid}) + (L\_\text{opticial lens} \cdot n\_\text{collimator}).$$

In this embodiment, the present invention teaches that the unique pivot axis 533 exists along the pivot plane 550. Thus, the diffraction grating 530 can be pivoted about the pivot axis 533, and pivot axis 533 can be moved arbitrary in the pivot plane 550 to move the diffraction grating 530 relative to the gain media 216 to continuously adjust the wavelength of the output light 512. Stated in another fashion, the pivot axis P can again be moved in a penalty free fashion along the pivot plane 550 and in a penalty fashion perpendicular to the pivot plane 550.

Figure 6:
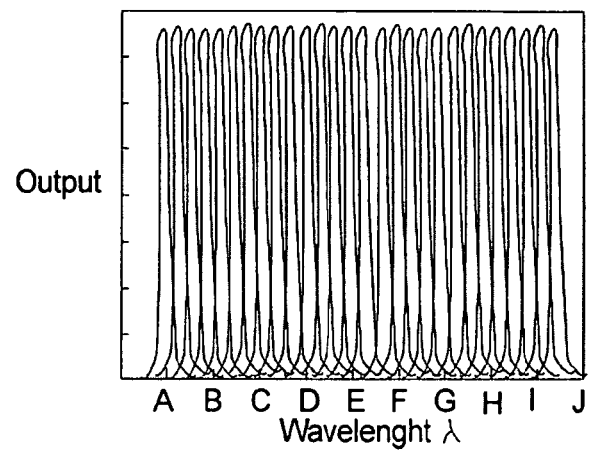
FIG. 6 is simplified graph that illustrates a plurality of possible alternative output lights versus wavelength that can be generated by the laser sources disclosed herein.
Figure 7:
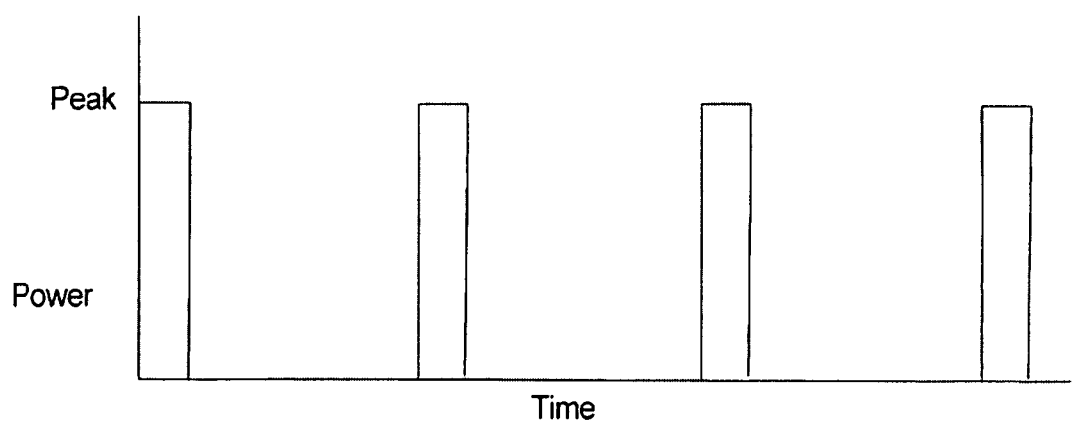
FIG. 7 is a graph that illustrates power directed to a gain media versus time.

FIG. 6 is a simplified graph that illustrates one non-exclusive example of the alternative wavelengths of possible output lights that can be generated by the laser sources 10, 210, 310, 410, 510 disclosed herein.

While the particular systems as shown and disclosed herein are fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A laser source for generating a continuously wavelength tunable light, the laser source comprising:
    a gain media having a first facet, and a second facet, the second facet being substantially non-reflective;
    an optical output coupler which reflects at least of a portion of the light back to the gain medium;
    a cavity collimator spaced apart from the second facet, the cavity collimator having a collimator apex located on a collimator surface that faces away from the second facet; wherein light exiting the collimator is collimated and travels along an optical axis which is defined by the gain media and the collimator, and wherein light between the collimator apex and the optical output coupler travels an apex/coupler group optical length which is equal to the effective distance that a ray of light propagates during movement from the collimator apex to the optical output coupler;
    a diffraction grating that is spaced apart from the cavity collimator, the grating cooperating with the optical output coupler to form an external cavity, the grating having a grating face surface that is in a grating plane, the grating reflecting at least a portion of the incident light back to the cavity collimator and into the cavity;
    a grating beam that retains the grating; and
    a beam attacher that retains the grating beam, the beam attacher allowing the grating beam and the grating to effectively pivot about a pivot axis, the pivot axis being is located approximately in a pivot plane, the pivot plane being normal to the optical axis, the pivot plane being spaced apart from the collimator apex a distance along the optical axis that is equal to the apex/coupler group optical length.

2. The laser source of claim 1 wherein the beam attacher includes a bearing that is centered near the pivot axis.

3. The laser source of claim 1 wherein the beam attacher includes a flexure that retains the grating beam.

4. The laser source of claim 1 further comprising a beam actuator that moves the grating beam to effectively pivot the grating about the pivot axis.

5. The laser source of claim 4 wherein the beam actuator moves the grating beam in a manner that the pivot axis always approximately resides in the pivot plane.

6. The laser source of claim 1 further comprising a mounting base that fixedly retains the gain media and the cavity.

7. The laser source of claim 6 wherein the beam attacher secures the grating beam to the mounting base.

8. The laser source of claim 6 further comprising a temperature controller that is in thermal communication with the mounting base, the temperature controller controlling the temperature of the mounting base and the gain media.

9. The laser source of claim 1 wherein the gain media is a quantum cascade type gain media and the cavity collimator is an aspheric lens.

10. The laser source of claim 1 wherein (i) the gain media has an integrated optical waveguide structure, and is characterized by a group media optical length along the waveguide; and (ii) the cavity collimator has a collimator axis, and a collimator group optical thickness along the collimator axis; wherein the apex/coupler group optical length is calculated by summing the waveguide group optical lengths of every component of the laser cavity from the collimator apex to the output coupler reflecting surface including free space regions of the cavity.

11. A laser source for generating a continuously wavelength tunable light, the laser source comprising:
    a gain media having a first facet, a second facet, a media axis, and a media length along the media axis;
    an optical output coupler;
    a cavity collimator spaced apart from the second facet, the cavity collimator having a collimator axis, a collimator thickness along the collimator axis, and a collimator apex located on a collimator surface that faces away from the second facet; wherein light exiting the collimator at the collimator apex travels along an optical axis that is defined by the gain media and the cavity collimator; wherein light between the collimator apex and the optical output coupler travels an apex/coupler group optical length which is equal to the effective distance that a ray of light propagates during movement from the collimator apex to the optical output coupler; and wherein light between the collimator apex and the optical output coupler has an apex/coupler physical length that is the actual physical length that any ray of light travels during movement from the collimator apex to the optical output coupler;
    a diffraction grating that is spaced apart from the cavity collimator, the grating having a grating face surface that is in a grating plane;
    a grating beam that retains the grating; and
    a beam attacher that retains the grating beam, the beam attacher allowing the grating beam and the grating to effectively pivot about a pivot axis that is located approximately in a pivot plane, the pivot plane being normal to the optical axis, the pivot plane being spaced apart from the output coupler along the optical axis a separation distance that is equal to the apex/coupler group optical length minus the apex/coupler physical length.

12. The laser source of claim 11 wherein the beam attacher includes a bearing that is centered near the pivot axis.

13. The laser source of claim 11 wherein the beam attacher includes a flexure that retains the grating beam.

14. The laser source of claim 11 further comprising a beam actuator that moves the grating beam to effectively pivot the grating about the pivot axis.

15. The laser source of claim 14 wherein the beam actuator moves at least a portion of the beam attacher along the pivot plane.

16. The laser source of claim 11 further comprising a mounting base that fixedly retains the gain media and the cavity collimator.

17. The laser source of claim 16 wherein the beam attacher secures the grating beam to the mounting base.

18. The laser source of claim 11 wherein the gain media is a quantum cascade type gain media and the cavity collimator is an aspheric lens.

19. A laser source for generating a continuously wavelength tunable light, the laser source comprising:
a gain media having a straight waveguide, a first facet that is normal to the waveguide, and a second facet that is normal to the waveguide, the second facet being substantially non-reflective;
a cavity collimator spaced apart from the second facet, the cavity collimator being coaxial with the gain media, wherein light traveling between the gain media and the collimator has an optical axis;
a diffraction grating that is spaced apart from the cavity collimator, the grating having a grating face surface that is in a grating plane, the grating reflecting at least a portion of the incident light back into the cavity;
a grating beam that retains the grating; and
a beam attacher that retains the grating beam, the beam attacher allowing the grating beam and the grating to effectively pivot about a pivot axis, the pivot axis being is located approximately in a pivot plane, the pivot plane being normal to the optical axis, the pivot plane being spaced apart from the first facet a separation distance that is calculated using the following formula:

separation distance=$L\_lens*(n\_lens-1)+L\_media*(n\_gain-1)$ where L_lens is the physical length of the cavity collimator, n_lens is the group index of refraction of the cavity collimator, L_gain is the physical length of the gain media, and n_gain is the group index of refraction of the gain media.

20. A method for manufacturing laser source that generates a continuously wavelength tunable light, the method comprising the steps of:
providing a gain media having a first facet, and a second facet, the second facet being non-reflective;
reflecting at least of a portion of the light back to the gain medium with an optical output coupler;
providing a cavity collimator spaced apart from the second facet, the cavity collimator having a collimator apex located on a collimator surface that faces away from the second facet; wherein light exiting the collimator is collimated and travels along an optical axis which is defined by the gain media and collimator, and wherein light between the collimator apex and the optical output coupler travels an apex/coupler group optical length which is equal to the effective distance that a ray of light propagates during movement from the collimator apex to the optical output coupler;
positioning a diffraction grating spaced apart from the cavity collimator, the grating cooperating with the optical output coupler to form an external cavity, the grating having a grating face surface that is in a grating plane, the grating reflecting at least a portion of the incident light back to the cavity collimator and into the cavity;
retaining the grating with a grating beam; and
retaining the grating beam with a beam attacher, the beam attacher allowing the grating beam and the grating to effectively pivot about a pivot axis, the pivot axis being is located approximately in a pivot plane, the pivot plane being normal to the optical axis, the pivot plane being spaced apart from the collimator apex a distance along the optical axis that is equal to the apex/coupler group optical length.

* * * * *